(12) United States Patent
Lin

(10) Patent No.: US 7,549,113 B2
(45) Date of Patent: Jun. 16, 2009

(54) TURBO DECODER, TURBO DECODING METHOD, AND OPERATING PROGRAM OF SAME

(75) Inventor: Hua Lin, Tokyo (JP)

(73) Assignee: NEC Corporation, Tokyo (JP)

( * ) Notice: Subject to any disclaimer, the term of this patent is extended or adjusted under 35 U.S.C. 154(b) by 441 days.

(21) Appl. No.: 11/038,267

(22) Filed: Jan. 21, 2005

(65) Prior Publication Data

US 2005/0172204 A1 Aug. 4, 2005

(30) Foreign Application Priority Data

Jan. 21, 2004 (JP) .............................. 2004-012540

(51) Int. Cl.
*H03M 13/03* (2006.01)
(52) U.S. Cl. ..................... 714/794; 714/795
(58) Field of Classification Search ................. 714/794, 714/795
See application file for complete search history.

(56) References Cited

U.S. PATENT DOCUMENTS

| 6,950,476 | B2 * | 9/2005 | Tarrab et al. ................. 375/265 |
| 6,996,765 | B2 * | 2/2006 | Wolf et al. ................... 714/755 |
| 7,191,377 | B2 * | 3/2007 | Berens et al. ............... 714/755 |

OTHER PUBLICATIONS

J. Dielissen et al., "State vector reduction for initialization of sliding windows MAP", 2nd International Symposium on Turbo Codes & Related Topics, Sep. 4, 2000, XP009039864, pp. 387-390.

Reuven Dobkin et al., "Parallel VLSI Architecture for MAP Turbo Decoder", Internet article, Feb. 24, 2002, XP002326200, pp. 1-11.
Yuping Zhang et al., "Parallel Turbo Decoding", Circuits and Systems, Proceedings of the 2004 International Symposium in Vancouver, BC, Canada May 23-26, 2004, IEEE, vol. 2, XP010720217, pp. 509-512.
Zhongfeng Wang et al., "Area-Efficient High Speed Decoding Schemes for Turbo/Map Decoders", Internet article, IEEE, Dec. 2002, XP002326253, pp. 2633-2636.
Andrew J. Viterbii, "An Intuitive Justification and a Simplified Implementation of the MAP Decoder for Convolutional Codes", IEEE Journal on Selected Areas in Communications, vol. 16, No. 2, Feb. 1998, pp. 260-264.
Seokhyun Yoon, "A Parallel MAP Algorithm for Low Latency Turbo Decoding", IEE Communications Letters, vol. 6, No. 7, Jul. 2002, pp. 288-290.

* cited by examiner

*Primary Examiner*—Joseph D Torres
(74) *Attorney, Agent, or Firm*—Young & Thompson

(57) ABSTRACT

A turbo decoding method is capable of realizing high-speed and highly accurate decoding operations by improving initialization of path metric values for parallel decoding processing. Turbo encoded code data is divided into a first to an N-th sub-code blocks and parallel decoding processing on these sub-code blocks is performed. "A priori initialization processing unit" s are provided which employ a final calculated value in a preceding sub-code block as an initial value for calculation of a path metric value of each sub-code block excluding the first sub-code block in a forward direction and a final calculated value in a following sub-code block as an initial value for calculation of a path metric value of each sub-code block excluding the N-th sub-code block in a backward direction. After the a priori initialization processing of path metric values, parallel decoding processing on each sub-code block is performed.

6 Claims, 10 Drawing Sheets

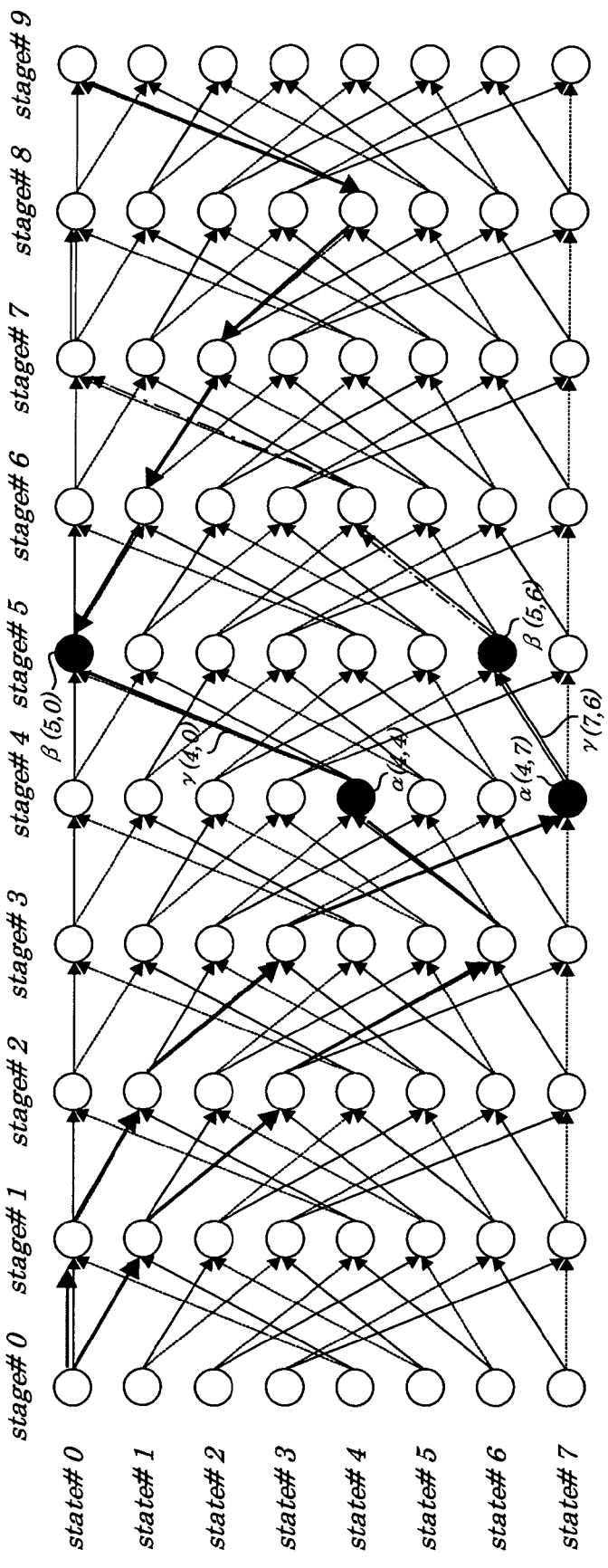

TURBO DECODER, TURBO DECODING METHOD, AND OPERATING PROGRAM OF SAME

BACKGROUND OF THE INVENTION

1. Field of the Invention

The present invention relates to a turbo decoder, a turbo decoding method, and an operating program of the same and more particularly to improvements in a high-performance and high-reliability turbo decoding method to decode a turbo code to be used in fields of communication systems and information processing systems.

The present application claims priority of Japanese Patent Application No. 2004-012540 filed on Jan. 21, 2004, which is hereby incorporated by reference.

2. Description of the Related Art

In recent years, a turbo code method which uses a so-called turbo code as an error-correcting code enabling a characteristic being near to the Shannon limit to be obtained is being studied and developed by C. Berrou et. al., as a high-performance and high-reliability coding method to be used in a wide range of communications and information processing including a mobile telecommunication system, information storage system, digital broadcasting system, and a like.

First, a general turbo encoder and a general turbo decoder are described. FIGS. 6 and 7 are schematic diagrams showing configurations of a publicly known conventional turbo encoder and a publicly known conventional turbo decoder. FIG. 6 shows the schematic block diagram showing the turbo encoder having a coding rate of ⅓, which includes Recursive Systematic Convolutional Encoders (may be simply referred to as element encoders) E11 and E22, and an interleaver E21. A "sequence of information bits to be encoded" (hereinafter, may be referred to as "information bit to be encoded") E01 is branched to be output as a sequence of systematic bits (hereinafter, may be simply referred to as systematic bit) E02 and to be input to the element encoder E11 and the interleaver E21.

The element encoder E11 encodes the "information bit to be encoded" E01 by using an error-correcting code, to output a sequence of redundancy bits (hereinafter, may be simply referred to as parity bit) E12. The interleaver E21 generally writes once the "information bit to be encoded" E01, reads out the "information bit to be encoded" E01 in a different order, and then transfers to the element encoder E22 with data being arranged in a mixed order. The element encoder E22 encodes the interleaved sequence of an information bit to be encoded by using element data and outputs a sequence of redundancy bits (hereinafter, may be simply referred to as parity bit) E23. In ordinary cases, as the element encoders E11 and E22, a recursive systematic convolutional encoder (RSC) is employed.

The turbo decoder shown in FIG. 7 includes element decoders D04 and D16, an interleaver D12, a de-interleaver D23, and a hard decision and decoder output block D25. To the element decoder D04 are input a systematic information sequence (hereinafter, may be simply referred to as systematic information) D01 corresponding to the systematic bit E02 and a parity information sequence (may simply referred to as parity information) D02 corresponding to the parity bit E12, and extrinsic information D03. Then, output extrinsic information D11 is used by the subsequent element decoder D16.

Moreover, the obtained extrinsic information D11 and the systematic information D01 are input to the element decoder D16, as extrinsic information D15 and the systematic information D13 through the interleaver D12, together with a parity information sequence (may be simply referred to as parity information) D14 corresponding to the parity bit E23. Then, soft output information D21 and extrinsic information D22 obtained by the element decoder D16 are transferred to the de-interleaver D23.

The de-interleaver D23 outputs information in order being reverse to order of interchanging of data made by the interleaver D12. That is, the order of each of the interleaved soft output information D21 and the extrinsic information D22 is made to get into its original order arranged before having been interleaved and the information is output as soft decision output information D24 and extrinsic information D03. Moreover, the hard decision and decoder output block D25 makes a hard decision on the soft decision output information D24 to output a final decoded result. The extrinsic information D03 is fed back to the element decoder D04 for subsequent decoding processing.

As described above, in the turbo decoder shown in FIG. 7, the decoding processing is repeated by renewing extrinsic information D15 from the element decoder D04 and the extrinsic information D03 from the element decoder D16 and, after a plurality of times of loop operations, a hard decision is made on the soft decision output information D24.

As a soft output decoding algorithm to be applied to the element decoder for turbo decoding, a MAP (Maximum A Posteriori Probability) decoding method is reported to be the best at present. However, this method has problems in that a device to perform this method becomes very large in size and an amount of processing is remarkably large and, therefore, in an actual installation, a Max-Log-MAP (Max Logarithmic Maximum A Posteriori) method in which the processing is simplified by judging whether transmitted data is "1" or "0" based on a maximum value of likelihood is generally and widely used.

A MAP algorithm is a maximum likelihood decoding algorithm using a trellis diagram. FIG. 8A is a diagram illustrating an example of an element encoder which shows a case in which the number of registers "D" is three. The trellis diagram, as shown in FIG. 8B, represents a relation between a value output when a value is input to the element encoder and a state of each of the registers "D".

The MAP algorithm roughly includes following three kinds of processing:
(a) Forward processing: To calculate a probability (forward path metric value) of reaching from a head of the trellis diagram to each state at each time point.
(b) Backward processing: To calculate a probability (backward path metric value) of reaching from an end of the trellis diagram to each state at each time point.
(c) Soft output generating processing and extrinsic value calculating processing: To calculate a soft output value of a systematic bit at each time point using results from the above processing (a) and (b) and further to calculate an extrinsic value using the soft output value.

In the trellis diagram, a forward path metric value and a backward path metric value to be calculated in each of forward and backward processing operations at a time point "t" (not shown) and in a state "s" (not shown) are represented as an Alpha value (t, s) (not shown) and Beta value (t, s) (not shown), respectively. Furthermore, a probability of transition from the state "s" to a state "s'" at the time point "t" is represented as a Gamma value (t, s, s') (here, the Gamma is called a "branch metric value"). The Gamma value (t, s, s') (not shown) is a probability that can be obtained from received values (systematic information sequence, parity information sequence, and extrinsic information).

Each of the forward processing operation, backward processing operation, soft output generating processing operation and extrinsic value calculating processing operation described above is performed as follows:

(a) Forward Processing Operation:

$$\text{Alpha}(t, s) = \text{Max}\{\text{Alpha}(t-1, s') + \text{Gamma}(t, s', s)\} \quad \text{Equation 1}$$

Here, in the above equation 1, the "Max" indicating the processing of obtaining a maximum value shows that the maximum value is to be calculated in all states "s'".

As shown in FIG. 9A, the Alpha value (t, S3) corresponding to a state (S3) at a time point "t" is calculated as follows. Out of metric values obtained by adding each of the Gamma branch metric values (t, S1, S3) and (t, S2, S3) to each of the Alpha path metric values (t−1, S1) and (t−1, S2) in two previous stages, the metric value being larger is determined as an Alpha value in the state [this calculation is called "Alpha ACS (Add-Compare-Select) calculation"]. This processing is performed in all states during all time change "t" and the Alpha values in all states are held.

Moreover, in the first calculation of the Alpha value, since there exists no Alpha value in the previous stage, setting of an initial value is required. Here, since a transition always starts from the State #0 (not shown) in the trellis diagram, as an initial Alpha value, the Alpha value of the State #0 is defined as "zero (0)" and the Alpha values of other States are defined as "−MAX (Minimum value) value".

(b) Backward Processing Operation:

$$\text{Beta}(t, s) = \text{Max}\{\text{Beta}(t+1, s') + \text{Gamma}(t+1, s, s')\} \quad \text{Equation 2}$$

As shown in FIG. 9B, the Beta value (t, S4) corresponding to a State (S4) at a time point "t" is calculated as follows (see equation 2). Out of metric values obtained by adding each of the branch metric Gamma values (t+1, S4, S5) and (t+1, S4, and S6) to each of the Beta path metric values (t+1, S5) and (t+1, S6) in two latter stages, the metric value being larger is determined as a Beta value in the State [this calculation is called "Beta ACS (Add-Compare-Select) calculation"].

This processing is performed in all States during all time change "t" and processing of calculating a Beta value from a direction reverse to the Alpha (that is, from a trellis final State side) is performed. Moreover, in the first calculation of the Beta value, since there exists no Beta value in the latter stage, setting of an initial value is required. Here, in the final end of the trellis diagram, as an initial Beta value, the Beta value of the State #0 is defined as "zero (0)" and the Beta values of other States are defined as "−MAX (Minimum value) value".

(c) Soft Output Generating Processing and Extrinsic Value Calculating Processing Operations:

All path metric values at the time point "t" are obtained by adding Alpha (t−1, s'), Beta (t, s), and Gamma (t, s', s) which have been already calculated. Then, a differential between a maximum path metric value of a path having a decoded result of "0 (zero)" and a maximum path metric value of a path having a decoded result of "1" becomes a soft output value at a time point "t"

In FIG. 10, the Alpha value (4, s'), Beta value (5, s), and Gamma value (5, s', s) are added to all combinations of (s, s') at the time point being five. Out of the results, a maximum path metric value L0 (t) having a decoded result of "0" (zero) is obtained.

In the example, the value L0 (t=5) is expressed as follows (equation 3:

$$L0(t = 5) = \text{Alpha } (t = 4, \text{ state } \#7) + \quad \text{Equation 3}$$
$$\text{Beta } (t = 5, \text{ state } \#6) +$$
$$\text{Gamma } (t = 5, \text{ state } \#7, \text{ state } \#6)$$

On the other hand, a maximum path metric value L1 (t) having a decoded result of "1" is also obtained. In the example, the value L1 (t=5) is expressed as follows (equation 4):

$$L1 \ (t = 5) = \text{Alpha } (t = 4, \text{ state } \#4) + \quad \text{Equation 4}$$
$$\text{Beta } (t = 5, \text{ state } \#0) +$$
$$\text{Gamma } (t = 5, \text{ state } \#4, \text{ state } \#0)$$

A soft output value at a time point being five is calculated as follows (equation 5):

$$L(t=5) = L0(t=5) - L1(t=5) \quad \text{Equation 5}$$

Moreover, in the Max-Log-MAP algorithm, a value obtained by deducting a channel value (value to be obtained from a received value) and an a priori value (extrinsic information to be supplied from the previous-stage decoder) from the soft output value (posteriori value) obtained as above is used as extrinsic information.

As described above, in the ideal Max-Log-MAP algorithm, operations of calculating the Alpha and Beta values are performed on all data to be decoded at the same time.

However, in the data transmission, as a data length increases, very large memory areas are required for Max-Log-MAP decoding. In particular, memory areas to store path metric information of an entire trellis are necessary. Moreover, due to an increase in a decoding length, a delay in decoding processing also increases and, therefore, it is difficult to apply the Max-Log-MAP algorithm to an actual real time system.

To solve this problem, a method called a sliding window is widely used (see A. J. Viterbi, "An Intuitive Justification and a Simplified Implementation of the MAP Decoder for Convolutional Codes" IEEE, J. Select. Areas Commun., Vol. 16, pp. 260-264, February 1998, hereinafter called a non-patent reference 1). In this method, only likelihood information in a trellis corresponding to a window size is stored and the window position is shifted until it reaches a decoding length, which enables a great reduction of the use of memory.

Furthermore, in recent years, a method is known in which one code block (data to be decoded) is divided into a plurality of sub-code blocks and each of the sub-code blocks is decoded in parallel (see S. Yoon, Y. Bar-Ness, "A Parallel MAP Algorithm for Low Latency Turbo Decoding" IEEE Communication Letters, Vol. 6, No. 7, pp. 288-290, July 2002, hereinafter called a non-patent reference 2). In the method, since path metric values (Alpha and Beta values) at a node (between a starting point and a final point of each sub-code block) are indefinite due to simultaneous processing of each sub-decoder, an Alpha initial value of a first sub-code block (the initial value being the same as set in the ideal Max-Log-MAP algorithm) and a Beta initial value of a final sub-code block (the initial value being the same as set in the ideal Max-Log-MAP algorithm) are removed and an Alpha initial value and a Beta initial value of each sub-code block in initial decoding processing are set forcedly.

The decoder disclosed in the non-patent reference 1 has a problem in that, though enabling the great reduction of the use of memory, decoding processing is performed in order of each window and, therefore, it is impossible to reduce entire decoding processing time. The decoder disclosed in the non-patent reference 2 also has a problem in that, since all Alpha and Beta values are set as 0 (zero), decoding errors occur in a node in a concentrated manner caused by division of the sub-code blocks. Therefore, in order to realize effective and high-speed turbo decoding, improvements in initialization of parallel decoding processing are expected.

SUMMARY OF THE INVENTION

In view of the above, it is an object of the present invention to provide a turbo decoder which is capable of decoding at a high speed by improvements of initialization of parallel decoding processing, a method for decoding, and an operation program of the decoding.

According to the present invention, there is provided a turbo decoder and method for dividing turbo encoded code data into a first to an N-th (N is an integer being two or more) sub-code blocks and for performing decoding processing on the sub-code blocks in parallel with each other, the turbo decoder including:

a priori initialization processing unit to obtain initial values to be used for calculating path metric values in forward and backward directions in each of the sub-code blocks, where the priori initialization processing unit includes, a first initialization processing stage in which, in each of the first to the N-th sub-code blocks, path metric values in the forward and the backward directions each are calculated using a preset initial value, and second to a K-th (K is an integer being two or more) initialization processing stages in which, in each of said sub-code blocks excluding the first sub-code block in each of the second to K-th initialization processing stages, a path metric value in the forward direction is calculated by using a final calculated value of the path metric value in the forward direction in a preceding sub-code block in a preceding initialization processing stage as an initial value and, in each of said sub-code blocks excluding the N-th sub-code block, a path metric value in the backward direction is calculated by using a final calculated value of the path metric value in the backward direction in a following sub-code block in the preceding initialization processing stage as an initial value;

N decoding units each corresponding to a respective one of said N sub-code blocks, said N decoding units each performing simultaneously the decoding processing on the corresponding sub-code blocks based on a corresponding input from said a priori initialization processing unit, the corresponding input comprising final calculated values of the path metric values in the forward and backward directions in the corresponding sub-code block in the K-th initialization processing stage; and a decoder output section connected to said decoding units that outputs a decoded result usable in one of a communication system and an information processing system.

With the above configuration, unlike in the conventional case where an encoded code block is divided into a plurality of sub-code blocks to perform decoding processing and, as a result, an initial value of each of Alpha and Beta path metric values in each of the sub-code blocks is indefinite, according to the present invention, such indefiniteness is removed by using an a priori initializing processing block and, therefore, decoding capability can be improved and, after the a priori initializing processing of these path metric values, the sub-decoder to process each sub-code block is operated at the same time, thus reducing a decoding delay in iterative decoding and achieving high-speed decoding processing.

BRIEF DESCRIPTION OF THE DRAWINGS

The above and other objects, advantages, and features of the present invention will be more apparent from the following description taken in conjunction with the accompanying drawings in which:

FIG. 10 is a diagram showing an example of calculation of soft output values.

DETAILED DESCRIPTION OF THE PREFERRED EMBODIMENTS

Best modes of carrying out the present invention will be described in further detail using various embodiments with reference to the accompanying drawings.

Embodiment

Figure 1:
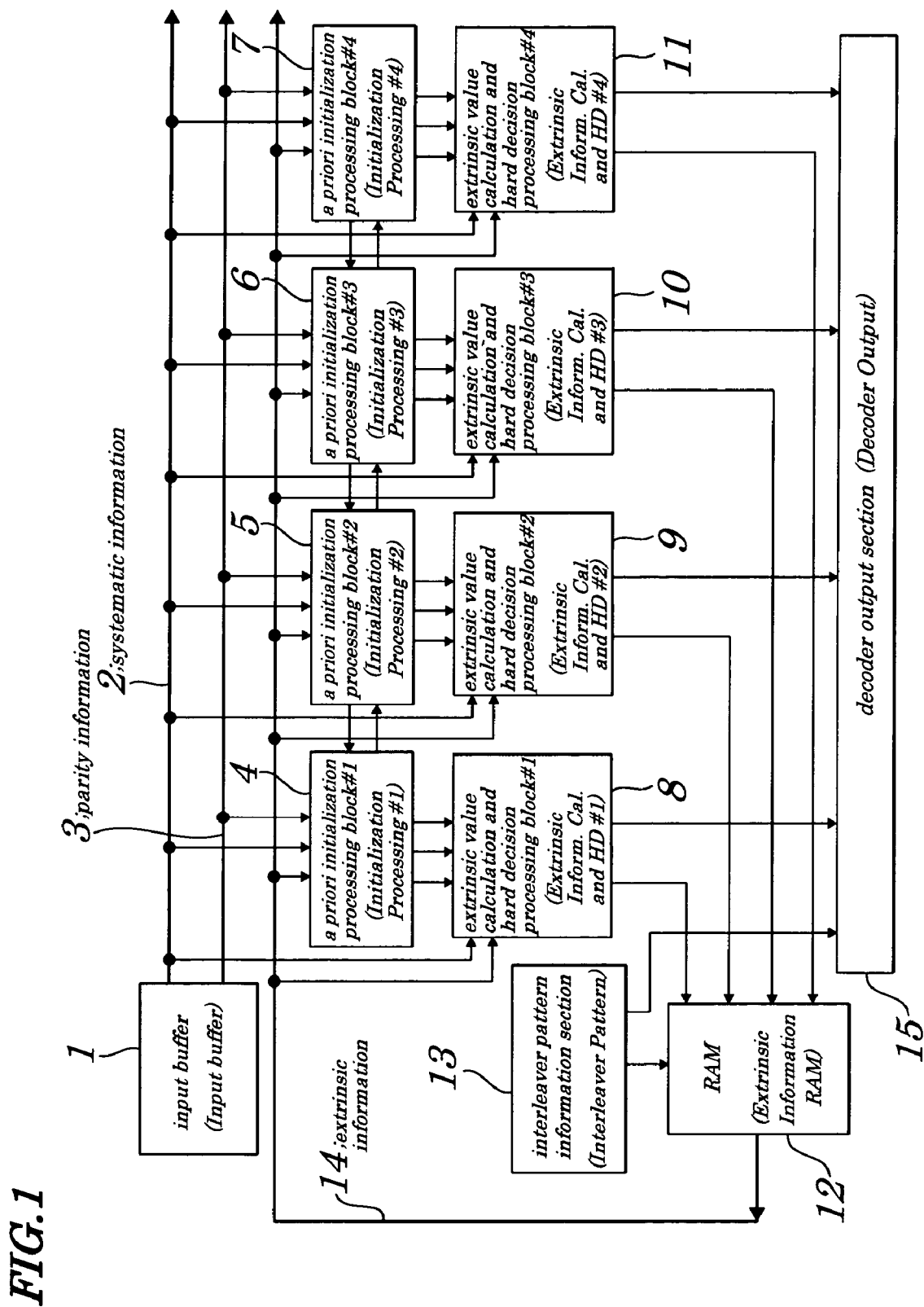
FIG. 1 is a functional block diagram showing configurations of a parallel turbo decoder according to an embodiment of the present invention.

FIG. 1 is a schematic block diagram showing configurations of a turbo decoder of an embodiment of the present invention. According to the present invention, a code block having a length of NW ("N" and "W" each are an integer being 2 or more) is divided into N pieces of sub-code blocks #1 to #4 each having a same length W (not shown) and each of the sub-code blocks is decoded in parallel. In the embodiment, as shown in FIG. 1, as an example, the number N of the sub-code blocks is four. Each of systematic information 2, parity information 3 and extrinsic information 14, that is, each of the systematic information 2, the parity information 3 output from a turbo decoding input buffer 1, and the extrinsic information 14 obtained from the preceding decoding operation in iteration decoding operations is divided into sub-code blocks #1 to #4 and each of the sub-code blocks #1 to #4 is input to each of sub-turbo decoders. A first sub-turbo decoder to decode a first sub-code block #1 is made up of an "a priori initialization processing block" 4 and an "extrinsic value calculation and hard decision processing block" 8.

Similarly, a second sub-turbo decoder is made up of an "a priori initialization processing block" 5 and an "extrinsic value calculation and hard decision processing block" 9. A third sub-turbo decoder is made up of an "a priori initialization processing block" 6 and an "extrinsic value calculation and hard decision processing block" 10. A fourth sub-turbo decoder is made up of an "a priori initialization processing block" 7 and an "extrinsic value calculation and hard decision processing block" 11.

A RAM (Random Access Memory) 12 is used to store extrinsic information output from each of "extrinsic value calculation and hard decision processing block"s (stage #1 to #4) 8 to 11 according to an interleaver pattern output from an interleaver pattern information section 13 and a decoder output section 15 derives each hard decision output from the "extrinsic value calculation and hard decision processing block"s (stages #1 to #4) 8 to 11 according to an interleaver pattern output from the interleaver pattern information section 13.

Path metric Alpha and Beta values obtained by a priori initializing processing in the "a priori initialization processing block"s (stages #1 to #4) 4 to 7 are transferred to each of the "extrinsic value calculation and hard decision processing block"s 8 to 11. Configurations of each sub-turbo decoder are the same and, therefore, only one example of detailed components of the one sub-turbo decoder is described here.

Figure 2:
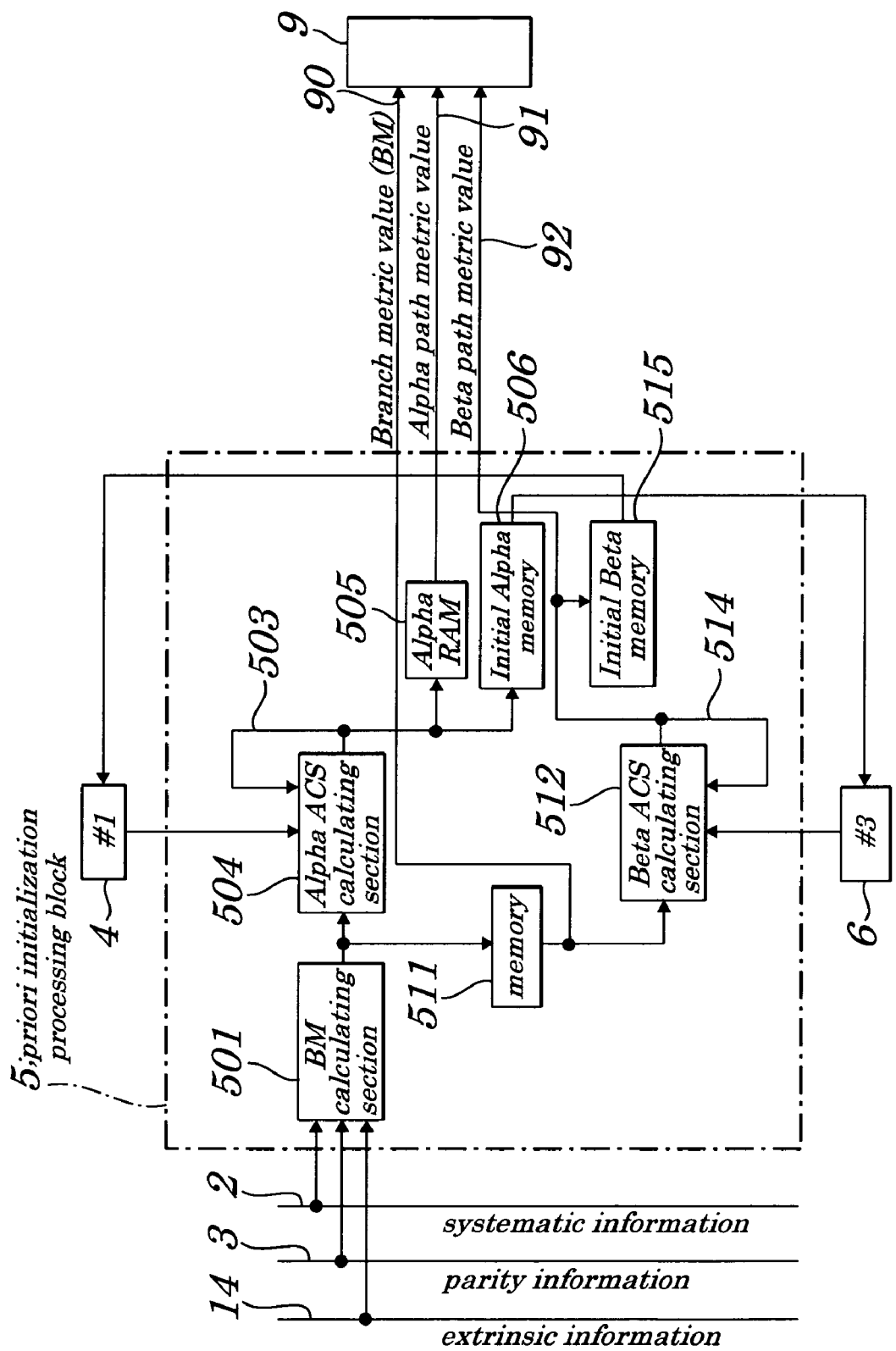
FIG. 2 is a functional block diagram illustrating an "a priori initialization processing block" shown in FIG. 1 according to the embodiment of the present invention.

FIG. 2 is a block diagram illustrating an example of configurations of the "a priori initialization processing block" (stage #2) 5 in a second turbo decoder of the embodiment of the present invention. A branch metric (BM) value is calculated from systematic information 2 obtained in the forward processing, parity information 3, and extrinsic information 14 in a BM calculating section 501. The calculated branch metric values are input to an Alpha ACS calculating section 504 and are stored in a memory 511 so that the values are used in a Beta ACS calculating section 512 and the "extrinsic value calculation and hard decision processing block" (stage #2) 9.

A value to be input to the Alpha ACS calculating section 504 includes a branch metric value being an output value from the BM calculating section 501, an initial value being used as an Alpha path metric value obtained in the initialization processing block (preceding-stage of block #1) 4 in a forward direction, and an Alpha path metric value 503 provided by a path used in the preceding-period state. A final Alpha path metric value calculated by the sub-code block #2 is written into an Alpha initialization value memory (hereinafter, referred to as initial Alpha memory) 506 and is then transferred, as an initial value, to the "a priori initialization processing block" (following-stage of block #3) 6. All the Alpha path metric values calculated in this sub-code block are written into an Alpha RAM 505 and are then transferred to the "extrinsic value calculation and hard decision processing block" 9.

A value to be input to the Beta ACS calculating section 512 includes a branch metric value read from the memory 511, an initial value being used as a Beta path metric value obtained in the initialization processing block (following-stage of block #3 in a backward direction) 6, and a Beta path metric value 514 provided by a path used in the preceding-period of stage. A final Beta path metric value making up the calculated sub-code block is written into a Beta initialization value memory (hereinafter, referred to as initial Beta memory) 515 and is then transferred, as an initial value, to the initialization processing block (following-stage block #1) 4. A Beta path metric value 92 is transferred to the "extrinsic value calculation and hard decision processing block" 9.

Figure 3:
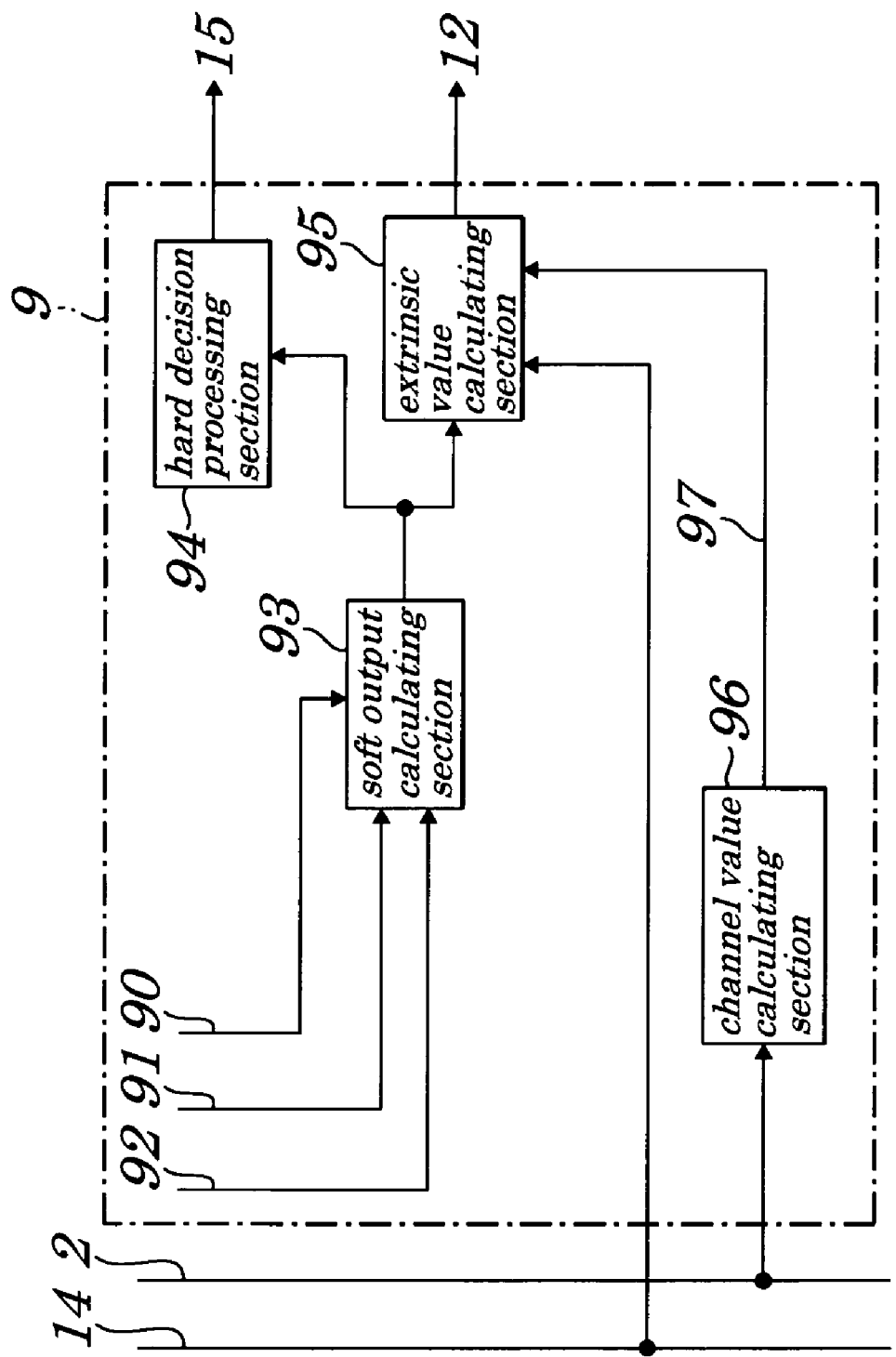
FIG. 3 is a functional block diagram for illustrating an extrinsic value calculation and hard decision processing section shown in FIG. 1 according to the embodiment of the present invention.

FIG. 3 is a block diagram illustrating an example of configurations of the "extrinsic value calculation and hard decision processing block" 9 in the second sub-turbo decoder of the embodiment of the present invention. In a soft output value calculating section 93, a soft output value is calculated from an Alpha path metric value 91, the Beta path metric value 92 and a branch metric value 90, all of which have been obtained in the initialization processing block (stage #2) 5. An input to a channel value calculating section 96 is the systematic information 2 and an output from the channel value calculating section 96 is channel information 97. An input to an extrinsic value calculating section 95 is the channel information 97 and the extrinsic information 14 and a soft output value obtained in the soft output value calculating section 93. The calculated extrinsic value is written into the extrinsic information RAM 12 (see FIG. 1) according to a pattern output from the interleaver pattern information section 13. Moreover, an output value from the soft output value calculating section 93 is input to a hard decision processing section 94 to perform a hard decision processing. A value from the hard decision processing section 94 is output to the decoder output section 15, as a decoded result, according to a pattern from the interleaver pattern information section 13.

Figure 4:
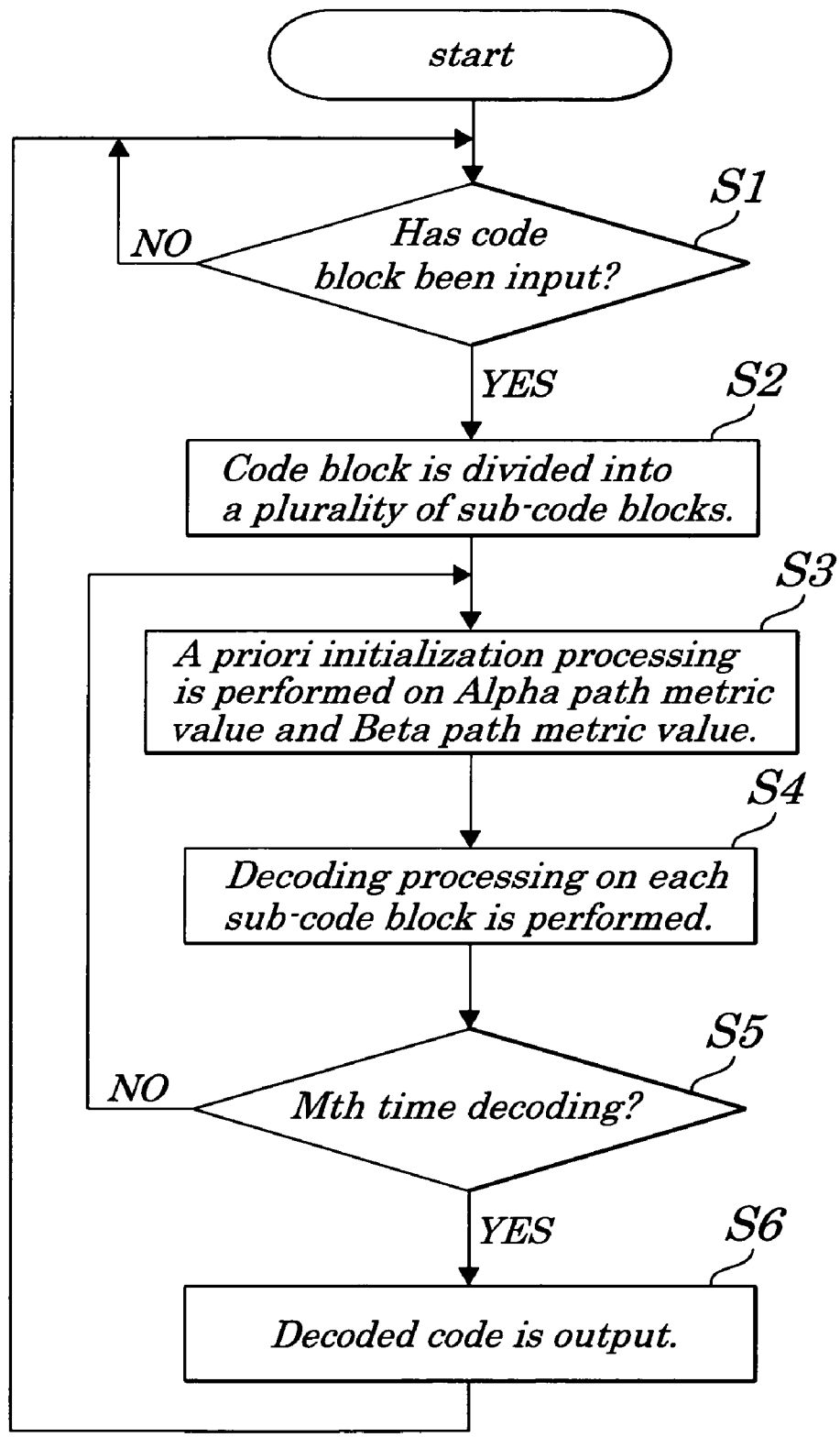
FIG. 4 is a flowchart showing a brief explanation of operations of a turbo decoder according to the embodiment of the present invention.
Figure 5:
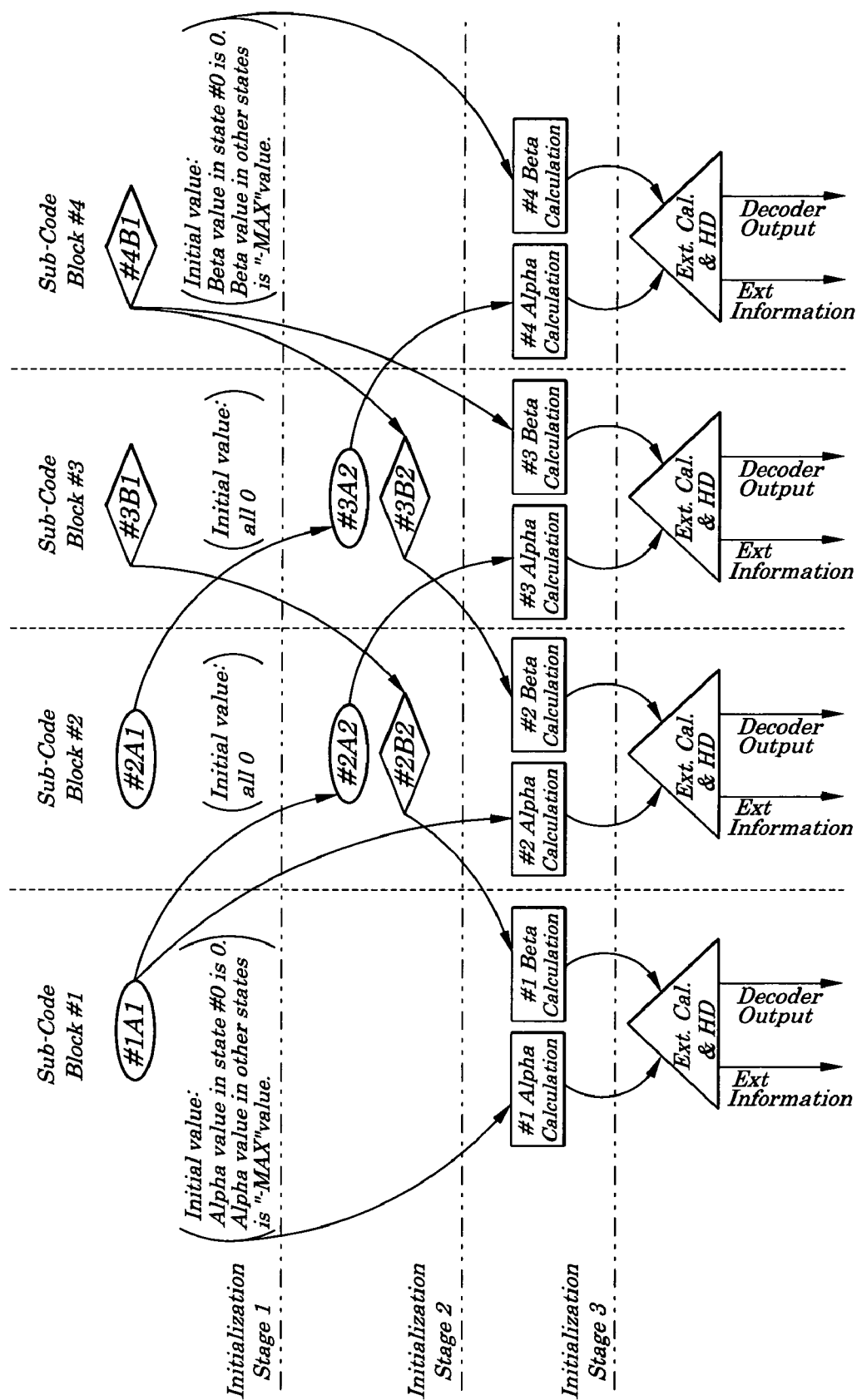
FIG. 5 is a diagram showing a process of decoding operations of the turbo decoder according to the embodiment of the present invention.

Next, operations to be performed by circuits shown in FIGS. 1 to 3 are described by referring to FIGS. 4 and 5. FIG. 4 is a flowchart briefly describing entire operations of the turbo decoder of the present invention. When an encoded code block is input (Step S1), the code block is divided into a plurality of sub-code blocks (four sub-code blocks (#1 to #4) in this embodiment) (Step S2) and is then fed to each of corresponding "a priori initialization processing block"s 4 to 7.

In each of the "a priori initialization processing block"s 4 to 7, apriori initialization processing is performed on an Alpha path metric value and a Beta path metric value of each sub-code block (Step S3). After that, parallel decoding processing on each sub-code block is performed (Step S4). Then, M (M is a positive integer) times of iterative decoding operations are performed (Steps S3 to S5) and a decoded output of the code block is derived finally (Step S6). The same processing is performed on a subsequent code block.

In the "a priori initialization processing block"s 4 to 7 of the embodiment of the present invention (Step S3 in FIG. 4), a plurality of initialization stages are set.

In the example shown in FIG. 5, the number of initialization stages K is three. In each of the stages-period (stages 1 and 2) except the final initialization stage (stage 3), Alpha and Beta path metric values are calculated. At this time point, by using, as an initial value, a final value of an Alpha path metric value of a previous sub-code block (forward direction) in each of previous stages, the Alpha path metric value is calculated in the Alpha ACS calculating section 504.

The final value obtained at this time point is stored in the initial Alpha memory 506 and is transferred, as an initial value, to a subsequent sub-code block (forward direction) in a subsequent stage, however, the final value is not yet stored in the Alpha RAM 505 and no processing of outputting the final value to the extrinsic value calculation and hard decision block 9 is performed.

At the same time, by using, as an initial value, a final value of the Beta path metric value of a previous sub-code block (backward direction) calculated in the previous stage, a Beta path metric value is calculated in the Beta ACS calculating section 512. The final value obtained here is stored in the initial Beta memory 515 and is transferred to a subsequent sub-code block (backward direction) in a subsequent stage and no processing of outputting the final value to the extrinsic value calculation and hard decision block 9 is performed.

For example, in the initialization processing stage (period) 2 in the second sub-code block #2, an initial value of the Alpha path metric value is a final value (#1A1) of the Alpha path metric value of the first sub-code block #1 obtained in the initialization processing stage (period) 1 and an initial value of the Beta path metric value is a final value (#3B1) of the Beta path metric value in the third sub-code block #3 obtained in the initialization processing stage (period) 1. Moreover, a final value (#2A2) of the Alpha path metric value and a final value (#2B2) of the Beta path metric value obtained in this stage 2 are transferred, as initial values, to the third sub-code block #3 and first sub-code block #1 respectively, in the stage 3.

That is, though all the Alpha and Beta path metric values are calculated in the initialization processing stages 1 and 2, it is only the final values of the Alpha and Beta path metric values that are used. Therefore, in each of the initialization processing stages 1 and 2, the BM calculating section 501, the memory 511, the Alpha ACS calculating section 504, the Beta ACS calculating section 512, the initial Alpha memory 506, the initial Beta memory 515 shown in FIG. 2 operate and a final value obtained by the Alpha ACS calculating section 504 and a final value obtained by the Beta ACS calculating section 512 are stored in the initial Alpha memory 506 and in the initial Beta memory 515 respectively and are then transferred, as initial values, respectively to subsequent sub-code blocks #3 and #1 in a subsequent stage.

In the stage 3, a final value output from the initial Alpha memory 506 in the forward direction in the previous stage is calculated, as an initial value, by the Alpha calculating section 504 and a final value output from the initial Beta memory 515 in the backward direction in the previous stage is calculated by the Beta ACS calculating section 512, and a result (Alpha path metric value 91) from the Alpha ACS calculation is transferred via the RAM 505, or a result (Beta path metric value 92) from the Beta ACS calculation is transferred together with a branch metric value 90 (output from the memory 511), to the extrinsic value calculation and hard decision block 9.

In this stage 3, as the Alpha path metric value making up the first sub-code block, a final calculated value of the Alpha path metric value calculated in the first stage 1 is stored, as it is, in the Alpha RAM 505 and is transferred to the extrinsic value calculation and hard decision block 8. As the Beta path metric value making up the fourth sub-code block, a final calculated value of the Beta path metric value calculated in the first stage 1 is transferred, as it is, to the extrinsic value calculation and hard decision block 11.

Moreover, calculation is performed, starting from a left end of each sub-code block (in a forward direction), to obtain the Alpha path metric value making up each sub-code. Calculation is performed, starting from a right end of a sub-block (in a backward direction) after the calculation on Alpha path metric value making up the entire sub-code block is terminated.

When the first decoding operation is performed in iterative operations, setting of the Alpha path metric initial value making up the leftmost sub-block (#1) in the first initialization processing stage and the Beta path metric initial value in the rightmost sub-block (#4) in the first initialization processing stage is done in the same way as employed in the ideal Max-Log-MAP algorithm. That is, in the decoding trellis, the Alpha and Beta values in State #0 are 0 (zero) and the Alpha and the Beta values in other States are "−MAX value" (minimum value). Other initial values, due to the division of the code block, are indefinite. In the embodiment, however, the initial values are all 0 (see the initialization processing stage 1 in FIG. 5).

In the initialization stage 3 being the final stage, Alpha and Beta path metric values in each sub-decoder are calculated. That is, all the Alpha and Beta path metric values are used in the initialization processing stage 3. Moreover, in the "extrinsic value calculation and hard decision processing block", by using the Alpha and Beta path metric values obtained in the final stage of the initialization process, a soft output value and extrinsic information are calculated. The extrinsic information obtained in each of the "extrinsic value calculation and hard decision processing block"s is stored in the RAM 12 according to an interleaver pattern output from the interleaver information section 13 and is transferred to a subsequent element decoder.

Figure 6:
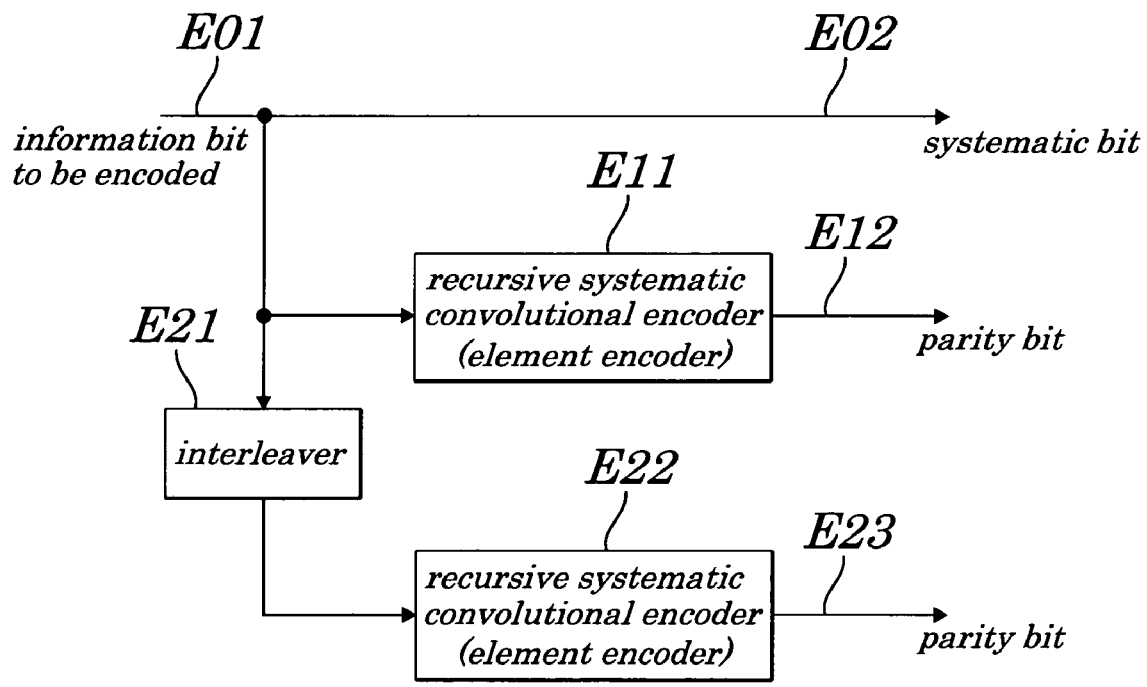
FIG. 6 is a diagram showing configurations of a conventional turbo encoder.
Figure 7:
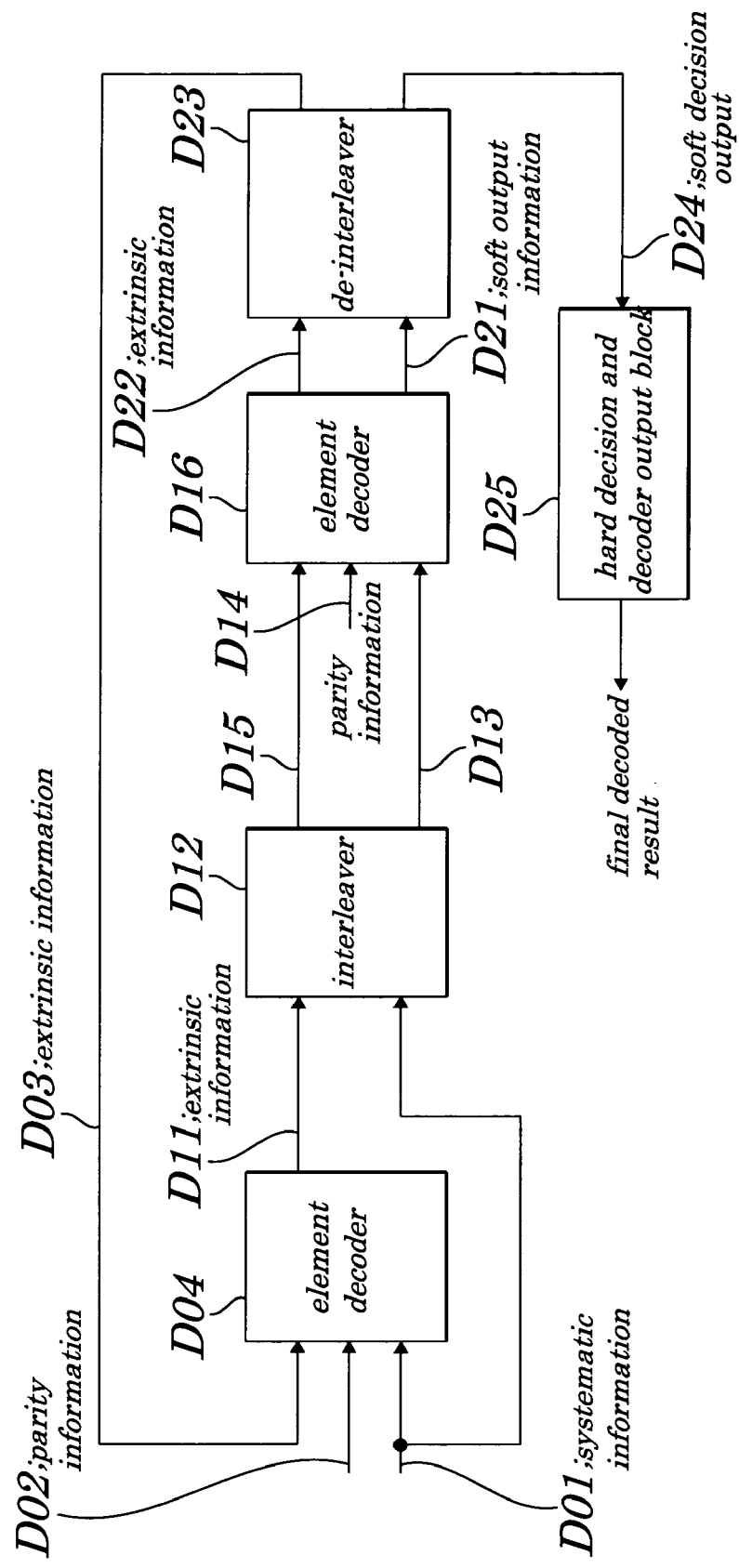
FIG. 7 is a diagram showing configurations of a conventional turbo decoder.
Figure 8A:
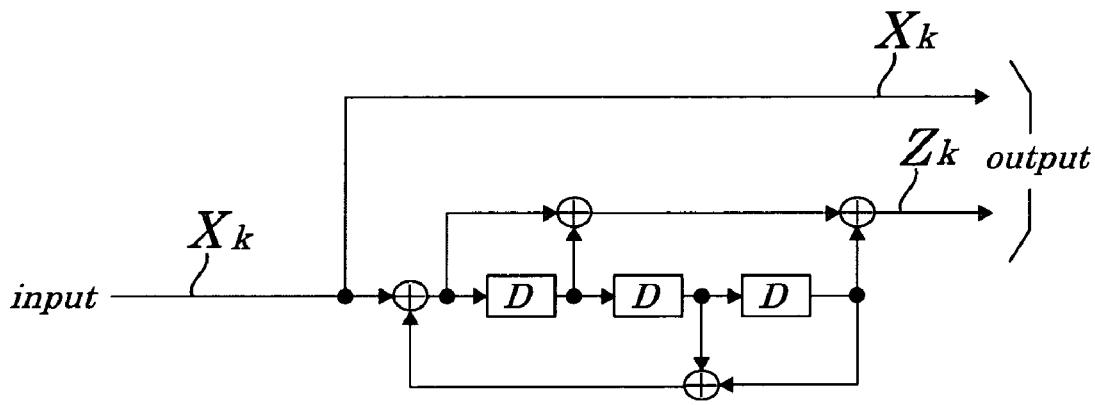
FIG. 8A is a diagram showing configurations of an element encoder.
Figure 8B:
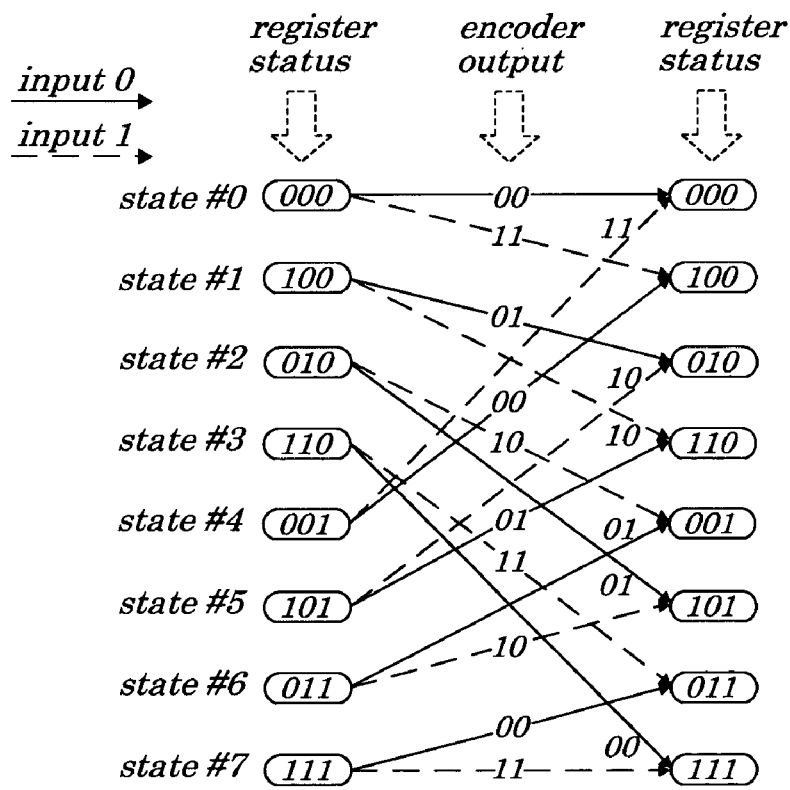
FIG. 8B shows an example of a trellis diagram.
Figure 9A:
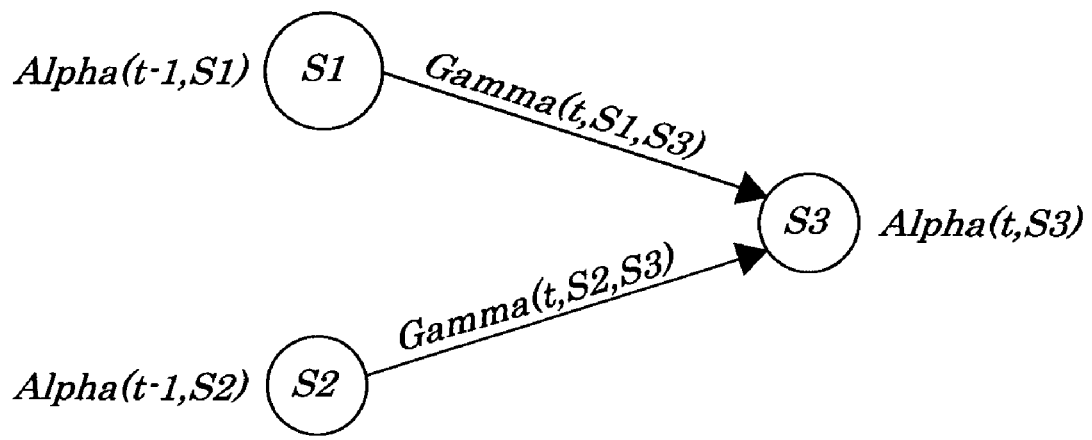
FIGS. 9A and 9B are diagrams showing examples of processing of ACS (Add-Compare-Select) calculating of the forward path metric Alpha value and backward path metric Beta value, respectively.
Figure 9B:
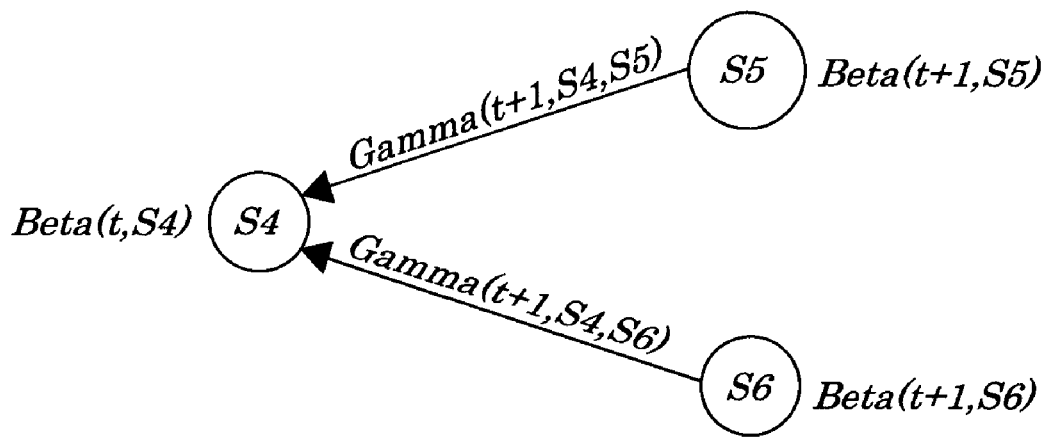

Moreover, as shown in FIG. 6, for convenience of explanation, the turbo decoder is generally made up of two element decoders. However, each of these two element decoders has the same configuration and, therefore, in the present invention, only one processing circuit is used to achieve the turbo decoder.

Furthermore, the turbo decoder, in order to perform iterative decoding operations using an interleaver, when the M-th (M is an integer being two or more) decoding operation is performed, sets the first (stage 1) Alpha and Beta initial values in the "a priori initialization processing block" as below. That is, setting of the Alpha path metric initial value making up the leftmost sub-block (#1) and the Beta path metric initial value in the rightmost sub-block (#4) is done in the same way as employed in the ideal Max-Log-MAP algorithm (see initial values in the leftmost and in the rightmost portions in the stage 1 in FIG. 5).

Initial values of other Alpha and Beta path metric values are as follows. An initial value of the Alpha path metric value is a final value of the Alpha path metric value obtained from a neighboring sub-code block ((N−1)-th sub-code block) in the final initialization processing stage (stage 3) at time of (M−1)-th decoding operations. An initial value of the Beta path metric value is a final value of the Beta path metric value obtained from a neighboring sub-code block ((N+1)-th sub-code block) in the final initialization processing stage (stage 3) at time of the (M−1)-th decoding operation.

It is apparent that the present invention is not limited to the above embodiments but may be changed and modified without departing from the scope and spirit of the invention. For example, a decoding algorithm applied to the embodiment of the present invention is the Max-Log-MAP algorithm, however, a Log-MAP (Logarithmic Maximum A Posteriori) algorithm that can faithfully realize a Maximum A Posteriori Probability decoding operation may be also employed.

Also, in the above embodiment, a length of a code block is divided into a plurality of code blocks each having an equal length. However, in actual operations, it is impossible to divide a code block into code blocks each having an equal length in some cases. When a length of a final sub-code block is shorter than that of other sub-code block, parallel decoding processing described above has to be achieved by adding dummy data. Moreover, in the embodiment of the present invention, the number of initialization stages K is three as shown in FIG. 5. However, as described above, as the number of initialization stages K increases, though the initial value of the Alpha or Beta path metric value making up each sub-code block is improved, hardware costs and circuit delays increase. As a result, in actual design, the number of initialization stages K has to be set by taking decoding capability, hardware costs, or a like into consideration.

Furthermore, in the above embodiment, though not shown, the processing shown in FIGS. 4 and 5 is performed by hardware shown in FIGS. 1 to 3, using a control section in the CPU. However, it is needless to say that the above processing may be performed by storing, in advance, the operating procedure in memory as a program and making the CPU (computer) read the contents to execute the program.

As described above, since path metric values (Alpha and Beta values) at a breakpoint (starting and ending points of each sub-code block), due to simultaneous processing of each sub-decoder, cannot use a path metric value obtained in a neighboring sub-code block, in the conventional case, its initial value is assumed as a fixed value (for example, 0) in a first time decoding processing and, as a result, extrinsic information calculated based on the setting of the initial value is different from the result from the ideal Max-Log-MAP algorithm. That is, extrinsic information becomes incorrect and capability of the iterative decoder is degraded.

To solve this problem, according to the present invention, in a previous decoding stage in which external value calculation and hard decision processing are performed by providing a plurality of a priori initialization processing stages and by performing initialization processing of a path metric of each sub-block in the a priori initialization processing stages, an initial value in each sub-block is improved as the number of initialization processing stages increases, thus improving a capability of decoding operations in the decoder. However, as the number of initialization processing stages increases, hardware costs and circuit delays increase and, therefore, in actual design, it is necessary to take a tradeoff among the number of initialization processing stages, decoding capability, and hardware costs into consideration.

Such an efficiency of high-speed decoding processing is needed in particular when the turbo decoder is installed in a device such as a portable cellular phone in which a real time characteristic of communications is strictly required.

What is claimed is:

1. A turbo decoder for dividing turbo encoded code data into first to N-th (N is an integer being two or more) sub-code blocks and for performing decoding processing on the sub-code blocks in parallel with each other, said turbo decoder comprising:

an a priori initialization processing unit that outputs initial values to be used for calculating path metric values in forward and backward directions in each of said sub-code blocks, wherein said a priori initialization processing unit comprises, a first initialization processing stage in which, in each of the first to the N-th sub-code blocks, path metric values in the forward and the backward directions each are calculated using a preset initial value, and second to a K-th (K is an integer being two or more) initialization processing stages in which, in each of said subcode blocks excluding the first subcode block in each of the second to K-th initialization processing stages, a path metric value in the forward direction is calculated by using a final calculated value of the path metric value in the forward direction in a preceding subcode block in a preceding initialization processing stage as an initial value and, in each of said subcode blocks excluding the N-th subcode block, a path metric value in the backward direction is calculated by using a final calculated value of the path metric value in the backward direction in a following subcode block in the preceding initialization processing stage as an initial value;

N decoding units each corresponding to a respective one of said N subcode blocks, said N decoding units each performing simultaneously the decoding processing on the corresponding sub-code blocks based on a corresponding input from said a priori initialization processing unit, the corresponding input comprising final calculated values of the path metric values in the forward and backward directions in the corresponding sub-code block in the K-th initialization processing stage; and a decoder output section connected to said decoding units that outputs a decoded result usable in one of a communication system and an information processing system.

2. The turbo decoder according to claim 1, wherein, in the K-th initialization processing stage in the first sub-code block, the final calculated value of the path metric value in the forward direction in the first initialization processing stage is used as an initial value, and in the N-th subcode block, the final calculated value of the path metric value in the backward direction in the first initialization stage is used as an initial value.

3. A turbo decoding method in which turbo encoded code data is divided into first to N-th (N is an integer being two or more) sub-code blocks and decoding processing is performed on the sub-code blocks in parallel with each other, said turbo decoding method comprising:

an a priori initialization processing step in which initial values to be used for calculating path metric values in forward and backward directions in each of said sub-code blocks are output, wherein said a priori initialization processing step comprises:

a first step of calculating path metric values in the forward and the backward directions each using a preset initial value, in each of the first to the N-th sub-code blocks, and second to K-th (K is an integer being two or more) steps of calculating, in each of the sub-code blocks excluding the first sub-code block in each of the second to K-th steps, a path metric value in the forward direction by using a final calculated value of the path metric value in the forward direction in a preceding sub-code block in a preceding step as an initial value and of calculating, in each of sub-code blocks excluding the N-th sub-code block, a path metric value in the backward direction by using a final calculated value of the path metric value in the backward direction in a following subcode block in the preceding step as an initial value;

a decoding step in which N decoding units each corresponding to a respective one of said N sub-code blocks each perform simultaneously the decoding processing on the corresponding sub-code blocks based on a corresponding input from said a priori initialization processing step, the corresponding input comprising final calculated values of the path metric values in the forward and backward directions in the corresponding sub-code block in the K-th initialization processing stage; and an output step in the decoding units output a decoded result usable in one of a communication system and an information processing system.

4. The turbo decoding method according to claim 3, wherein, in the K-th step, in the first sub-code block, the final calculated value of the path metric value in the forward direction in the first step is used as an initial value, and in the N-th sub-code block, the final calculated value of the path metric value in the backward direction in the first step is used as an initial value.

5. A turbo decoder for dividing turbo encoded code data into first to N-th (N is an integer being two or more) sub-code blocks and for performing decoding processing on each of said sub-code blocks in parallel with each other, said turbo decoder comprising:

an a priori initialization processing means for outputting initial values to be used for calculating path metric values in forward and backward directions in each of said sub-code blocks, wherein said a priori initialization processing means includes, a first initialization processing stage in which, in each of the first to the N-th sub-code blocks, path metric values in the forward and the backward directions each are calculated using a preset initial value; and second to a K-th (K is an integer being two or more) initialization processing stages in which, in each of said sub-code blocks excluding the first sub-code block in each of the second to K-th initialization processing stages, a path metric value in the forward direction is calculated by using a final calculated value of the path metric value in the forward direction in a preceding sub-code block in a preceding initialization processing stage as an initial value and, in each of said sub-code blocks excluding the N-th sub-code block, a path metric value in the backward direction is calculated by using a final calculated value of the path metric value in the backward direction in a following sub-code block in the preceding initialization processing stage as an initial value;

N decoding means each corresponding to a respective one of said N sub-code blocks, said N decoding means each performing simultaneously the decoding processing on the corresponding sub-code blocks based on a corresponding input from said a priori initialization processing means, the corresponding input comprising final calculated values of the path metric values in the forward and backward directions in the corresponding sub-code block in the K-th initialization processing stage; and decoder output means connected to said decoding means that outputs a decoded result usable in one of a communication system and an information processing system.

6. The turbo decoder according to claim 5, wherein, in the K-th initialization processing stage in the first sub-code block, the final calculated value of the path metric value in the forward direction in the first initialization processing stage is used as an initial value, and in the N-th sub-code block, the final calculated value of the path metric value in the backward direction in the first initialization stage is used as an initial value.

* * * * *